(12) United States Patent
Chinda et al.

(10) Patent No.: US 7,780,836 B2
(45) Date of Patent: Aug. 24, 2010

(54) METHOD FOR FABRICATING A MULTILAYER WIRING BOARD, MULTILAYER WIRING BOARD, AND ELECTRONIC DEVICE USING THE SAME

(75) Inventors: Akira Chinda, Hitachi (JP); Nobuaki Miyamoto, Hitachi (JP); Mamoru Mita, 3-16-14, Tajiricho, Hitachi-shi, Ibaraki (JP)

(73) Assignees: Hitachi Cable, Ltd., Chiyoda-ku, Tokyo (JP); Mamoru Mita, Hitachi-shi, Ibaraki (JP)

( * ) Notice: Subject to any disclaimer, the term of this patent is extended or adjusted under 35 U.S.C. 154(b) by 906 days.

(21) Appl. No.: 11/544,720

(22) Filed: Oct. 10, 2006

(65) Prior Publication Data

US 2007/0034519 A1   Feb. 15, 2007

(30) Foreign Application Priority Data

Nov. 8, 2005   (JP)   ............... 2005-323156

(51) Int. Cl.
C25D 5/02   (2006.01)
(52) U.S. Cl. ..................... 205/125; 205/118
(58) Field of Classification Search .......... 205/118, 205/125
See application file for complete search history.

(56) References Cited

U.S. PATENT DOCUMENTS 4,931,148 A * 6/1990 Kukanskis et al. .......... 205/126
6,270,889 B1 * 8/2001 Kataoka et al. ............. 428/352
2005/0218480 A1 * 10/2005 Usui et al. .................. 257/632

FOREIGN PATENT DOCUMENTS

| CN | 1434495 A | 1/2002 |
|---|---|---|
| JP | 5-152746 | 6/1993 |
| JP | 10-22634 | 1/1998 |
| JP | 2004-319593 | 11/2004 |

OTHER PUBLICATIONS

Chinese Office Action dated Jul. 2, 2008 with English-Language Translation.

* cited by examiner

Primary Examiner—Luan V Van
(74) Attorney, Agent, or Firm—McGinn IP Law Group, PLLC (57) ABSTRACT

On both surfaces of an electric insulating material 1, a surface conductive layer 2A and a back surface conductive layer 2B are formed by transcription. Further, a via hole 5 penetrating through the surface conductive layer 2A and the electric insulating material 1 is provided. After forming a photosensitive plating resist pattern 14, the via hole 5 is filled with a copper plating filler 15, and the surface wiring layer 9A and the back surface wiring layer 9B are formed. Thereafter, the photosensitive plating resist pattern 14 as well as the surface conductive layer 2A and the back surface conductive layer 2B provided under the photosensitive plating resist pattern 14 are removed to fabricate a double-sided wiring board 11.

8 Claims, 9 Drawing Sheets

METHOD FOR FABRICATING A MULTILAYER WIRING BOARD, MULTILAYER WIRING BOARD, AND ELECTRONIC DEVICE USING THE SAME

The present application is based on Japanese Patent Application No. 2005-323156 filed on Nov. 8, 2005, the entire contents of which are incorporated herein by reference.

BACKGROUND OF THE INVENTION

1. Field of the Invention

The invention relates to a method for fabricating a multilayer wiring board on which a semiconductor device, passive element electronic parts, functional elements or the like are mounted, a multilayer wiring board, and an electronic device using the same.

2. Description of the Related Art

In these days, it is desired that the electronic parts such as a semiconductor device, resistor, capacitor or the like are miniaturized and slimmed, for realizing the light-weighting of electronic apparatus such as a digital still camera, a video camera, and a cellular phone. For example, as to the resistor and capacitor, a 0603 (0.6 mm×0.3 mm) microchip resistors are put to practical use. In addition, as to the semiconductor chip, a bare chip is directly installed on a substrate without using a semiconductor package. Furthermore, even when the semiconductor package is used, a CSP (Chip Scale Package) in which a size of the semiconductor package is approximately same as that of the semiconductor chip is often used.

In the current of such miniaturization and slimming of the device, as a rigid wiring board with multilayered wirings for mounting these elements, so-called "buildup substrate" in which a plurality of wiring layers are stacked on via insulating layers is used recently. However, even in the field of the buildup substrate, a limit of the micro wiring layout is already conceived, so that a method for fabricating a high density wiring board compared with the method using the buildup substrate is strongly desired.

Accordingly, a wiring tape for TAB (Tape Automated Bonding) (hereinafter, referred as "TAB tape") is recently used as a substrate for mounting a semiconductor device. This TAB tape is fabricated by sticking a copper foil on a thin film composed of polyimide or the like, and forming a wiring pattern on this copper foil. By using the TAB tape, there are advantages in that the minute wiring layout can be realized, that the thickness of the substrate can be reduced since a thin film is used, and that an area and a volume required for incorporation of the semiconductor device into the electronic device can be reduced since the substrate can be used with bending.

On the other hand, a FPC (Flexible Printed Circuit) is also used as a substrate for mounting a semiconductor device. This FPC is fabricated by using a thin film such as polyimide similarly to the TAB tape, and the FPC is advantageous in that the manufacturing of the device with a wide width is possible. The segregation in characteristics of the TAB tape and the FPC is as follows. The TAB tape is used for small-sized electronic apparatuses requiring the high density wiring board while the FPC is used for medium size electronic apparatuses using the ordinary wiring board.

As a technique for forming the wiring in the TAB tape or the like, the subtractive process, in which a copper layer formed on one surface of a substrate film is masked with a photoresist (photosensitive resin), and a part not to be used as a wiring is etched (removed) by solution to provide a wiring pattern, has been generally used. For example, Japanese Patent Laid-Open No. 2004-319593 discloses such subtractive process.

Nowadays, a wiring width and a wiring interval between wiring conductors of the TAB tape using this subtractive process is narrowed to a width of about 20 µm and a pitch of about 40 µm in mass-production level, by improving the photochemical etching process of the copper foil and by application of a thinner copper foil. However, the improvement of the wiring width and the wiring interval between the wiring conductors of the TAB tape using the subtractive process almost reaches to the technical limit.

In addition, in the subtractive process, there is a basic problem in that the wiring width is reduced in accordance with the progress of the etching (side-etching phenomenon). The photoresist is exfoliated due to the reduction in the wiring width, and chemical dissolution of the copper foil begins from the exfoliated part, as a result, defectiveness of the wiring due to the breaking of wire occurs. In addition, the wiring interval is increased by the reduction in the wiring adversely, so that a required wiring width is hardly obtained. As the corrective action, a correction of the photomask is conducted with considering the decrease in the wiring width and the increase in the wiring interval. However, the wiring width and the wiring interval of an etched product should be measured many times to be fed back to the photomask preparation, thereby causing the complication of the manufacturing process and the obstacle for shortening the product delivery date.

On the other hand, in the buildup substrate, a catalyst such as palladium (Pd) is provided on an insulating substrate and chemical copper plate is applied thinly then an electrolytic copper plating of about 10 µm is applied thereon. Finally, the wiring pattern is formed by the photo chemical etching. Therefore, in the buildup substrate, the basic problems due to the subtractive process are also left similarly to the FPC and the TAB tape.

Against the background as explained above, a method for fabricating a micro wiring board with a wiring pitch of 40 µm or less by using an additive process is studied in place of the subtractive process. The additive process is classified into a semi-additive process using the electrolytic copper plating method and a full-additive process using the electroless copper plating method.

The full-additive process is a process comprising the steps of providing the Pd catalyst on an electric insulating substrate, forming a plating resist by the photo process, conducting the electroless copper plating on an opening of the plating resist, exfoliating the plating resist thereafter, and removing the Pd catalyst provided right under the plating resist to form the wiring pattern. The full-additive process is disclosed, for example, by Japanese Patent Laid-Open No. 10-22634 and Japanese Patent Laid-Open No. 5-152746. On the other hand, the semi-additive process is a process comprising the steps of providing an electroless copper plating thinly, and forming a thick copper plating by using the electrolytic copper plating, by which the plating can be thickened in a short time compared with the electroless copper plating, to form the wiring pattern.

However, according to the additive process such as the full-additive process and the semi-additive process, the electroless copper plating is conducted by using a high temperature and high alkaline plating solution containing a copper complex such as EDTA-Cu. The plating solution to be used is expensive, in addition, the crystallization speed is $1/10$ or less of the ordinary electroplating. Namely, the crystallization speed of the plating is extremely low. Further, the plating resist film is exfoliated due to the high temperature and high alkaline electroless copper plating solution. Still further, in the TAB tape and the FPC using a polyimide as the electric insulating substrate, the electric insulating substrate itself is chemically dissolved and damaged due to the high temperature and high alkaline electroless copper plating solution.

Recently, a method for forming a backing conductive layer by evaporation or sputtering in place of the electroless copper plating is used, so as to solve the above problems. In this method, for example, a coating such as titanium (Ti) or chromium (Cr) is provided to have a thickness of around 100 Å on a surface of a polyimide film, and a copper film with a thickness of about 3 μm is further provided on the coated surface. In this method, there are advantages in that provision of catalyst such as PD for the electroless copper plating is not necessary, and that the electroless copper plating can be omitted.

FIGS. 9A to 9H show an example of a conventional method for fabricating a multilayer wiring board (double-sided wiring board) using the aforementioned technique.

Figure 9A:
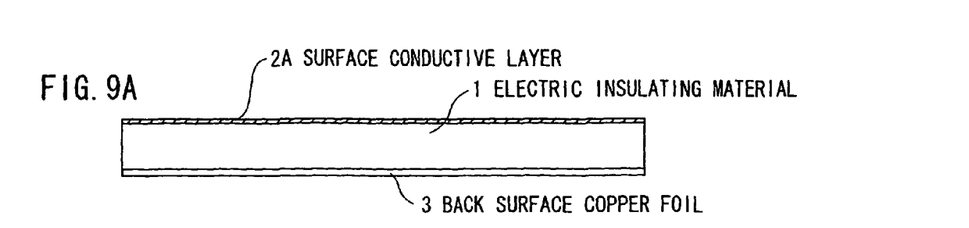
FIGS. 9A to 9H are schematic views showing a conventional method for fabricating conventional double-sided wiring board.

At first, a back surface copper foil 3 is stuck by adhesive to a back surface of an electric insulating material 1 composed of polyimide. Generally, a thickness of the polyimide film is about 20 to 50 μm, and a thickness of the copper foil is 10 to 20 μm. Next, a surface conductive layer 2A is formed on another surface (front surface) of the electric insulating material 1 (FIG. 9A). This surface conductive layer 2A is formed as follows. Firstly, a diffusion laminar film of, for example, chromium metal is formed to have a thickness of about 100 Å by sputtering, and a copper film is similarly formed to have a thickness of about 1000 Å by a vapor phase method such as the sputtering, then another copper film is grown thereon to have a thickness of about 3 μm by chemical copper plating or electrolytic copper plating.

Figure 9B:
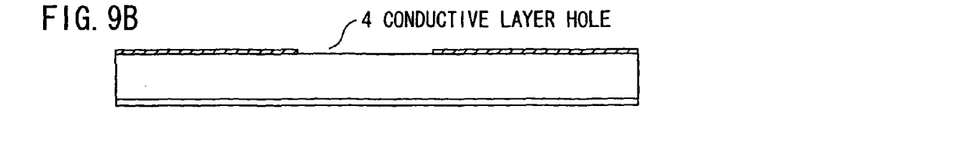
Figure 9C:
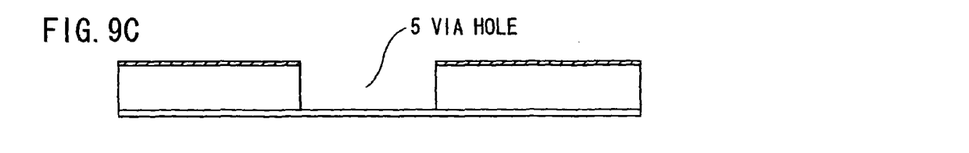

Next, a conductive layer hole 4 is formed on the surface conductive layer 2A by photochemical etching method (FIG. 9B). Then a via hole 5 is opened by means of excimer laser and $CO_2$ laser or reactive plasma using gas containing $CF_4$ or the like (FIG. 9C).

Figure 9D:
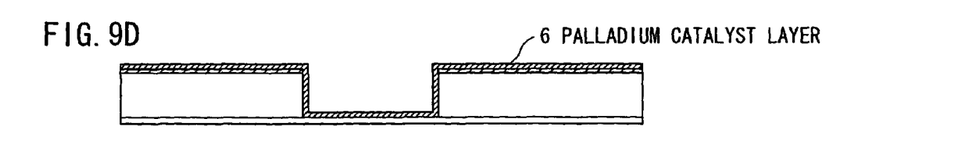
Figure 9E:
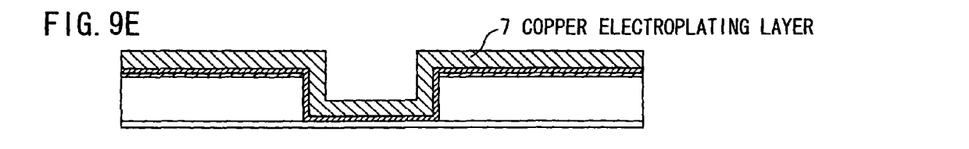

Further, a process for providing a palladium catalyst layer 6 to provide an inner wall of the via hole 5 with the conductivity is conducted (FIG. 9D). Then an electroplating copper layer 7 is formed thereon (FIG. 9E).

Figure 9F:
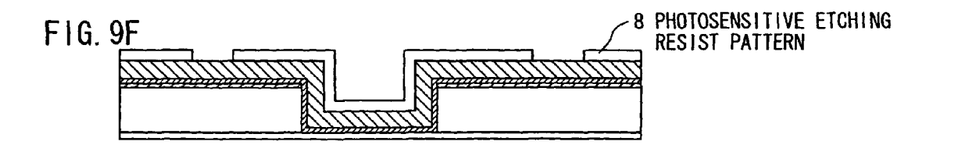

Next, a photosensitive etching resist is coated on the front surface then a photosensitive etching resist pattern 8 is formed by exposure and development (FIG. 9F). Then a surface wiring layer 9 is formed by using a chemical etching solution such as aqueous ferric chloride and the photosensitive etching resist is removed (FIG. 9B).

Figure 9G:
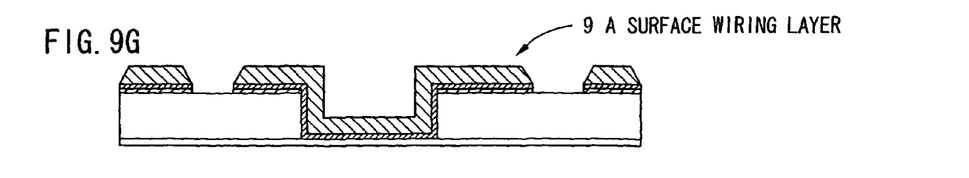
Figure 9H:
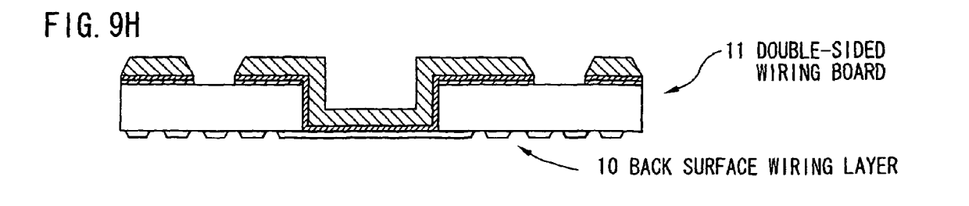

For the back surface copper foil 3, a back surface copper wiring layer 10 is similarly formed by the photochemical etching so that a double-sided wiring board 11 is completed (FIG. 9H). The above-mentioned method is actually applied, as one of the methods for forming a wiring on the buildup substrate.

However, there are following disadvantages in the conventional methods for forming a multilayer wiring board.

(1) Limit of the Wiring Density

Since the wiring layer is formed by the chemical etching (the subtractive process), an edge of the surface wiring layer 9 has a trapezoidal cross section due to the side etching, so that the wiring width and the wiring interval in the finished state are fluctuated from the design values of the wiring width and the wiring interval as shown in FIG. 9G. Therefore, it is necessary to correct the mask to be used for the exposure. In addition, since a degree of the side etching depends on the wiring density, the spray condition of the etching solution or the like, it is difficult to prevent the variation of the wiring width and the wiring interval even if the correction is conducted. Accordingly, as described above, when using the conventional chemical etching, the wiring interval of 40 μm is the limit for the mass production in the high density wiring board such as the TAB tape.

(2) Prolongation and Complication of the Manufacturing Process

The vapor phase method such as the sputtering is used for forming the surface conductive layer 2A, so that it takes a long time for the film formation. In addition, since the surface wiring layer 9 and the back surface wiring layer 10 are formed in separate processes as shown in FIGS. 9A to 9H, the manufacturing process becomes complicated.

(3) Expensive Process Equipment

Since the vapor phase method such as the sputtering is used for forming the surface conductive layer 2A, the equipment used for the process is very expensive.

SUMMARY OF THE INVENTION

Accordingly, it is an object of the invention to solve the above problems in the conventional art, in concrete, to provide a method for fabricating a multilayer wiring board, a multilayer wiring board, and an electronic device using the same, in which the manufacturing process is simplified by an inexpensive method without using the vapor phase method such as the sputtering in the formation of the surface conductive layer, and the high density wiring with the wiring interval of 40 μm or less can be achieved.

In the present invention, the multilayer wiring board means the wiring board comprising two or more wiring layers.

According to a feature of the invention, a method for fabricating a multilayer wiring board comprises the steps of:

preparing a conductive layer forming material including a film-shaped reinforcing material and a separable thin film type conductive layer formed on the film-shaped reinforcing material;

transcribing the thin film type conductive layer from the conductive layer forming material to both surfaces of a lengthy electric insulating material to form a surface conductive layer and a back surface conductive layer;

providing a via hole penetrating through the surface conductive layer and the electric insulating material;

forming a pattern composed of a photosensitive plating resist film with a desired shape at a predetermined position of the surface conductive layer and the back surface conductive layer;

conducting an electroplating with using the back surface conductive layer as a cathode to fill the via hole with an electroplating metal and to form a surface wiring layer and a back surface wiring layer respectively at a space in the pattern of the photosensitive plating resist film; and removing the photosensitive resist film as well as the surface wiring layer and the back surface wiring layer provided under the photosensitive resist film to form a conductive wiring pattern comprising the surface wiring layer and the back surface wiring layer.

According to a further feature of the invention, a method for fabricating a multilayer wiring board, comprises the steps of:

preparing a conductive layer forming material including a film-shaped reinforcing material and a separable thin film type conductive layer formed on the film-shaped reinforcing material;

transcribing the thin film type conductive layer from the conductive layer forming material to both surfaces of a lengthy electric insulating material, in which a film shaped back surface conductive layer is formed at its back surface, to form a surface conductive layer and a back surface conductive layer;

providing a via hole penetrating through the surface conductive layer and the electric insulating material;

forming a pattern composed of a photosensitive plating resist film with a desired shape at a predetermined position of the surface conductive layer;

conducting an electroplating with using the back surface conductive layer as a cathode to fill the via hole with an electroplating metal and to form a surface wiring layer at a space in the pattern of the photosensitive plating resist film;

removing the photosensitive resist film as well as the surface wiring layer provided under the photosensitive resist film to form a conductive wiring pattern comprising the surface wiring layer; and forming a conductive wiring pattern composed of a back surface wiring layer from the back surface conductive layer.

According to a still further feature of the invention, a method for fabricating a multilayer wiring board comprises the steps of:

applying a photosensitive permanent resist to a film shaped back surface conductive layer;

providing a via hole on the photosensitive permanent resist;

conducting an electroplating with using the back surface conductive layer as cathode to fill the via hole with an electroplating metal over a region which is longer than a length of the via hole;

preparing a conductive layer forming material including a film-shaped reinforcing material and a separable thin film type conductive layer formed on the film-shaped reinforcing material;

transcribing the thin film type conductive layer from the conductive layer forming material to a surface of the photosensitive permanent resist to form a surface conductive layer;

forming a photosensitive plating resist film pattern with a desired shape on the surface conductive layer;

conducting an electroplating with using the back surface conductive layer as a cathode to form a surface wiring layer at a space in the pattern of the photosensitive plating resist film pattern;

removing the photosensitive resist film as well as the surface wiring layer provided under the photosensitive resist film to form a conductive wiring pattern comprising the surface wiring layer; and forming a conductive wiring pattern composed of a back surface wiring layer from the back surface conductive layer.

According to another feature of the invention, a method for fabricating a multilayer wiring board comprises the steps of:

preparing a conductive layer forming material including a film-shaped reinforcing material and a separable thin film type conductive layer formed on the film-shaped reinforcing material;

transcribing the thin film type conductive layer from the conductive layer forming material to a surface of an electric insulating wiring board having a conductive wiring pattern to form a surface conductive layer and a back surface conductive layer;

providing a via hole in the surface conductive layer and the electric insulating wiring board;

forming a pattern composed of a photosensitive plating resist film with a desired shape at a predetermined position of the surface conductive layer;

conducting an electroplating with using the surface conductive layer as a cathode to fill the via hole with an electroplating metal and to form a surface wiring layer at a space in the pattern of the photosensitive plating resist film; and removing the photosensitive resist film as well as the surface wiring layer provided under the photosensitive resist film to form a conductive wiring pattern comprising the surface wiring layer.

The method for fabricating a multi layer wiring board may further comprise the steps of:

transcribing the thin film type conductive layer from the conductive layer forming material to a back surface of the electric insulating wiring board;

providing a via hole in the back surface conductive layer and the electric insulating wiring board;

forming another pattern composed of the photosensitive plating resist film with a desired shape at a predetermined position of the back surface conductive layer;

conducting the electroplating with using the back surface conductive layer as a cathode to fill the via hole with the electroplating metal and to form a back surface wiring layer at a space in the pattern of the photosensitive plating resist film; and removing the photosensitive resist film as well as the back surface wiring layer provided under the photosensitive resist film to form another conductive wiring pattern comprising the back surface wiring layer.

In the method for fabricating a multilayer wiring board, the via hole may be formed by laser beam method, dry chemical etching method, or reactive plasma aching.

In the method for fabricating a multilayer wiring board, the surface wiring layer may be processed by photochemical etching method or direct laser beam method.

According to a still another feature of the invention, a multilayer wiring board comprises:

an electric insulating material;

a via hole penetrating through a front surface and a back surface of the electric insulating material, the via hole being filled with a copper plating;

a surface wiring layer formed by the copper plating on the front surface of the electric insulating material; and a back surface wiring layer formed by the copper plating on the back surface of the electric insulating material.

In the multilayer wiring board, a wiring pitch of the surface wiring layer and the back surface wiring layer may be less than 40 μm.

According a further feature of the invention, a multilayer wiring board comprises:

an electric insulating material;

a via hole penetrating through a front surface and a back surface of the electric insulating material, the via hole being filled with a copper plating; and a surface wiring layer formed by the copper plating and continuously with the copper plating on the front surface of the electric insulating material.

In the multilayer wiring board, a wiring pitch of the surface wiring layer may be less than 40 μm.

According to a still further feature of the invention, a multilayer wiring board comprises:

a photosensitive permanent resist;

a via hole penetrating through a front surface and a back surface of the photosensitive permanent resist, the via hole being filled with a copper plating; and a surface wiring layer formed by the copper plating on the front surface of the photosensitive permanent resist.

In the multilayer wiring board, a wiring pitch of the surface wiring layer may be less than 40 μm.

According to another feature of the invention, a multilayer wiring board comprises:

a double-sided printed wiring board;

a via hole provided at a predetermined position on an upper surface side of the double-sided printed wiring board, the via hole being filled with a copper plating; and a surface wiring layer formed on the via hole.

In the multilayer wiring board, a wiring pitch of the surface wiring layer may be less than 40 μm.

According to a still another feature of the invention, an electronic device comprises:

a multilayer wiring board including an electric insulating material, a via hole penetrating through a front surface and a back surface of the electric insulating material, the via hole being filled with a copper plating, a surface wiring layer formed by the copper plating on the front surface of the electric insulating material, and a back surface wiring layer formed by the copper plating on the back surface of the electric insulating material; and one of a semiconductor element, a passive element, and a functional part.

According to the present invention, it is possible to provide a method for fabricating a multilayer wiring board, a multilayer wiring board, and an electronic device using the same, in which the manufacturing process is simplified by the inexpensive method, and the high density wiring with the wiring interval of 40 μm or less can be achieved.

BRIEF DESCRIPTION OF THE DRAWINGS

The invention is described in conjunction with appended drawings.

DETAILED DESCRIPTION OF THE PREFERRED EMBODIMENTS

Next, the preferred embodiments according to the present invention will be described in more detail in conjunction with the appended drawings.

First Preferred Embodiment

Structure of a Double-Sided Wiring Board

Figure 1:
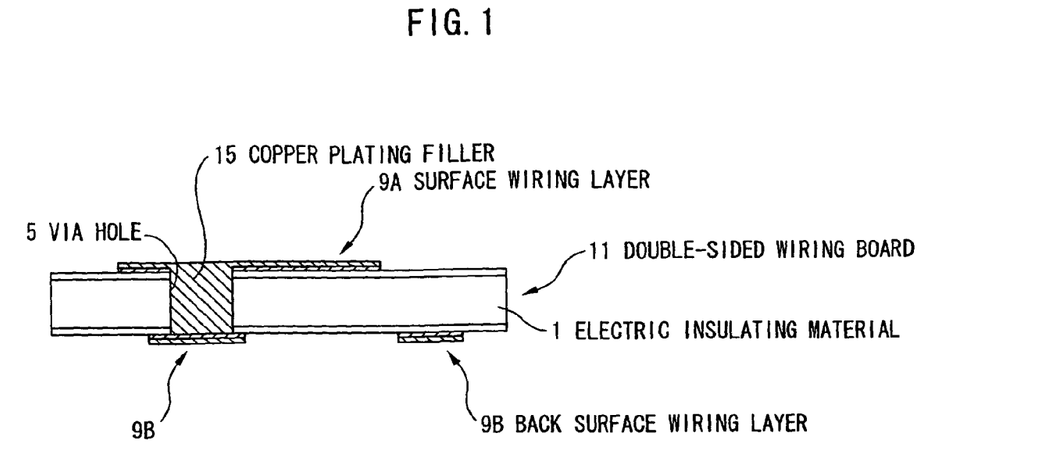
FIG. 1 is a cross sectional view showing a double-sided wiring board in the first preferred embodiment according to the present invention.

FIG. 1 shows a cross sectional view of a double-sided wiring board in the first preferred embodiment according to the present invention.

A double-sided wiring board 11 comprises an electric insulating material 1, a via hole 5 penetrating through the electric insulating material 1 from a front surface to a back surface, a copper plating filler 15 for filling the via hole 5, a surface wiring layer 9A formed on the front surface, and a back surface wiring layer 9B formed on the back surface.

Method for Fabricating the Double-Sided Wiring Board

Based on FIGS. 2A to 2I, a method for fabricating the double-sided wiring board shown in FIG. 1 is explained.

Figure 2A:
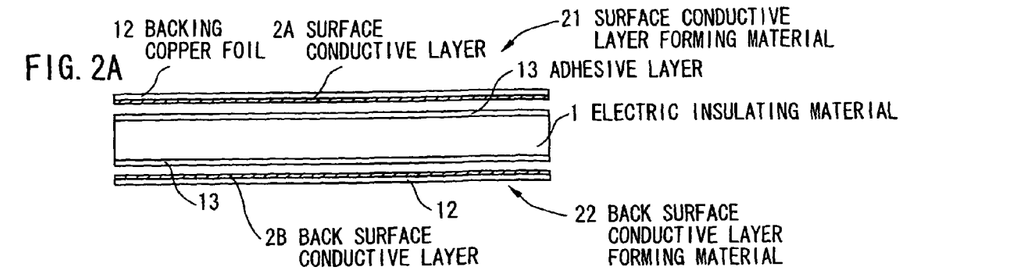
FIGS. 2A to 2I are cross sectional views showing a method for fabricating the double-sided wiring board shown in FIG. 1.

At first, for an electric insulating material 1 shown in FIG. 2A, a high heat-resistant material composed of, for example, polyimide is prepared. For the case using a TAB tape, it is possible to use a polyimide tape generally having a width of 35, 70, or 105 mm and a thickness of 25 or 38 μm.

Next, a surface conductive layer forming material 21 and a back surface conductive layer forming material 22 are prepared for forming a surface conductive layer 2A and a back surface conductive layer 2B on both surfaces of the electric insulating material 1. The surface conductive layer forming material 21 comprises the surface conductive layer 2A on one surface of a backing copper foil 12. Similarly, the back surface conductive layer forming material 22 comprises the surface conductive layer 2B on one surface of the backing copper foil 12. Adhesion between the backing copper foil 12 and the surface conductive layer 2A (or the back surface conductive layer 2B) is weak, so that they can be easily exfoliated. For example, in the surface conductive layer forming material 21 (or the back surface conductive layer forming material 22), a thin barrier layer (not shown) comprising an electric chromium plating layer is formed between the backing copper foil 12 and the surface conductive layer 2A (or the back surface conductive layer 2B) to improve the separability. The adhesion between the barrier layer and the copper is weak and functions as a barrier of the thermal diffusion by heating, so that they can be exfoliated easily.

Figure 2B:
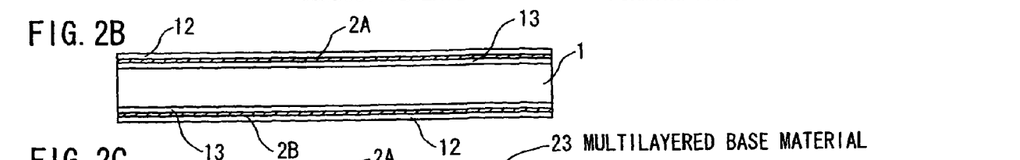

Next, both surfaces of the electric insulating material 1 are sandwiched by the surface conductive layer forming material 21 and the back surface conductive layer forming material 22 via adhesive layers 13, respectively, and stuck with each other by a roll laminator (FIGS. 2A and 2B). For the adhesive layer 13, thermosetting epoxy resin system, thermoplastic polyimide resin system, polyether amide imide system, NBR synthetic rubber, bismaleimide system, and thermosetting epoxy/maleimide system or the like can be used. When using the thermosetting resin, the heat treatment for finishing the curing reaction is conducted after applying the adhesive layer 13. On the other hand, when using the thermoplastic resin as the adhesive layer 13, the electric insulating material 1 sandwiched by the surface conductive layer forming material 21 and the back surface conductive layer forming material 22 can be used after sticking without conducting the heat treatment.

Figures 2C, 2D:
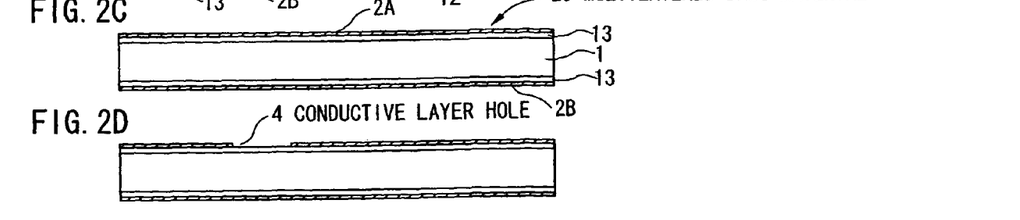

Next, the backing copper foils 12, 12 on the both surfaces are exfoliated, so that a multilayered base material 23, in which the surface conductive layer 2A and the back surface conductive layer 2B are formed via the adhesive layer 13 respectively on the both surfaces of the electric insulating material 1, is provided (FIG. 2C).

In this preferred embodiment, the surface conductive layer 2A and the back surface conductive layer 2B are formed simultaneously on the electric insulating material 1 in a single process, however may be formed separately in different processes.

Next, a conductive layer hole 4 is opened at the surface conductive layer 2A of the multilayered base material 23 by using the photochemical etching process or the direct laser beam method (FIG. 2D). The minimum diameter of the conductive layer hole 4 is determined by the resolution of the photoresist, and can be selected in the range of a diameter of 30 to 60 μm, for example. The aqueous ferric chloride may be used for the chemical etching.

Figure 2E:
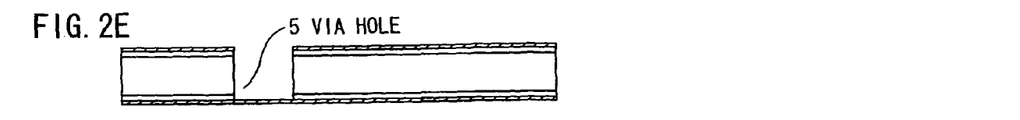

Furthermore, a via hole 5 is formed by oxygen plasma etching, $CO_2$ laser, excimer laser, dry chemical etching, a reactive plasma aching or the like (FIG. 2E). In a case where the via hole 5 is formed with the CO2 laser, a smear (undecomposed residue) is left at a surface and a periphery of the via hole 5, so that it is preferable to remove the smear by oxygen plasma or the like.

Figures 2F, 2G:
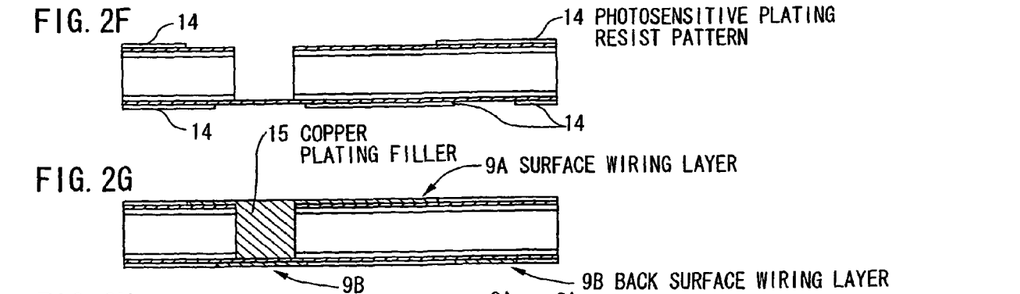

Thereafter, a photosensitive dry film photoresist is stuck to both surfaces of the multilayered base material 23 to form a photosensitive plating resist pattern 14 respectively on the both surfaces. A thickness of the dry film is for example 10 μm. After sticking together, the exposure and development are conducted, so that the photosensitive plating resist pattern 14 is respectively completed on the both surfaces (FIG. 2F). In the photosensitive plating resist pattern 14 (drawing of pattern is omitted), it is possible to provide e.g. a wiring width of 10 μm, a wiring interval of 10 μm, and a wiring pitch of 20 μm on the front and back surfaces respectively.

After forming the photosensitive plating resist pattern 14, the plating conditioning such as degreasing-pickling, activation, or the like is conducted. The electrolytic copper plating is conducted in a copper sulfate plating bath using the back surface conductive layer 2B as cathode, and the copper plating is provided for an opening of the via hole 5 to provide a copper plating filler 15, subsequently the pattern plating is conducted for both the front and back surfaces, to form a surface wiring layer 9A and a back surface wiring layer 9B (FIG. 2G). Since the copper plating filler 15 is thicker than the wiring layer, the plating time for the via hole 5 is set to be longer by arranging a position of an anode. This electroplating process may be conducted by using a plating apparatus with continuous winding system. In concrete, a long plating bath is disposed between a wind-off reel and a wind-up unit. Anodes composed of copper plate are disposed on both surfaces of the plating bath, and the copper plates functioning as the anodes are located facing to the surfaces subjected to the electroplating. As for the travel of the material, it does not matter whether the material is arranged vertically or horizontally. A length of a region, where the anode is disposed, is lengthened at the via hole filling part and shortened at a wiring forming part, so that the plating thickness at the wiring forming part and the via hole part can be controlled in the continuous winding process.

In additions the electrolytic copper plating may be conducted after the plating resist pattern formation process followed by the palladium (Pd) catalyzing treatment. By conducting the palladium catalyzing treatment, the adhesion between the inner wall of the via hole and the electrolytic copper plating can be enhanced.

Figures 2H, 2I:
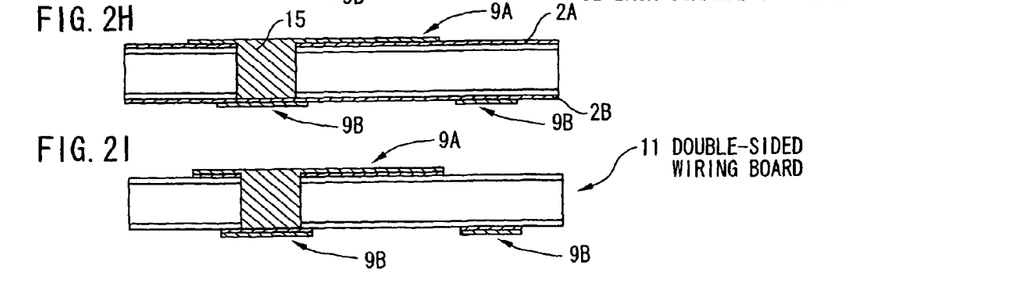

After forming the surface wiring layer 9A and the back surface wiring layer 9B, the photosensitive plating resist patterns 14 at the front and back surfaces are removed (FIG. 2H). Then the surface conductive layer 2A and the back surface conductive layer 2B are further removed by dissolving, so that a double-sided wiring board 11 is completed (FIG. 2I).

For the removal of the surface conductive layer 2A and the back surface conductive layer 2B by dissolving, hydrogen peroxide supplemented ammonium solution, hydrogen peroxide supplemented sulfuric acid solution, or aqueous ferric chloride may be used. Since the surface conductive layer 2A and the back surface conductive layer 2B are thinner than the surface wiring layer 9 and the back surface wiring layer 10 formed by the electrolytic copper plating, it is hard to assume that the surface wiring layer 9A and the back surface wiring layer 9B will disappear due to the removal by dissolving. However, it is preferable that Au electroplating is applied to have a thickness of about 0.01 to 0.1 μm prior to the removal of the photosensitive plating resist pattern 14, in a case where each of the thickness of the surface wiring layer 9A and the back surface wiring layer 9B is close to the thickness of the surface conductive layer 2A and the back surface conductive layer 2B. According to this process, the surface wiring layer 9A and the back surface wiring layer 9B are protected by the thin Au-plating film, so that the decrease in thickness due to the etching using the dissolution liquid can be prevented.

Effect of the First Preferred Embodiment (1) In the first preferred embodiment, the photosensitive plating resist is etched for forming the wiring pattern, not like the conventional subtractive process in which the wiring layer is removed by the chemical etching. Accordingly, the formation limit of the wiring pitch can be determined based on the resolution of the photosensitive plating resist, so that the wiring density can be improved to be narrower than 40 μm pitch. Therefore, in comparison with the conventional subtractive process, the wiring density can be improved.

Furthermore, the side etching occurs in the conventional subtractive process, an edge of the surface wiring layer has a trapezoidal cross section, so that the wiring width and the wiring interval in the finished state are fluctuated from the design values of the wiring width and the wiring interval. However, according to the wiring formation in this preferred embodiment, the edge of the surface wiring layer has a rectangular cross section, and the wiring width and the wiring interval are equal to the mask design values.

(2) Since the electroless copper plating and the expensive film formation process are not used, even when the double-sided wiring board or the multilayer wiring board comprising triple wiring layers or more are fabricated, it is expected that the manufacturing time and the manufacturing cost of the multilayer wiring board can be reduced compared with conventional method.

(3) Since the high temperature high alkaline electroless copper plating is not used, the polyimide and the photosensitive resin which are insulating materials vulnerable to alkali can be prevented from the damage, so that the electrical characteristics and other strength characteristics of the wiring board are not deteriorated. Accordingly, the improvement in the reliability of the multilayer wiring board can be expected.

(4) Since the double-side wiring can be simultaneously formed, the manufacturing process can be shortened in comparison with the conventional method, and the manufacturing cost of the double-sided wiring board can be expected.

Example 1

A double-sided wiring board 11 was fabricated by the method for fabricating a double-sided wiring board in the first preferred embodiment shown in FIGS. 2A to 2I.

On one surface of a backing copper foil 12 with a thickness of 18 μm and a width of 26.5 mm, a chromium electroplating layer is formed to have a thickness of 0.02 μm. Then a surface conductive layer 2A is formed to have a thickness of 2 μm by the electrolytic copper plating using a copper sulfate plating bath to provide a surface conductive layer forming material 21. In similar manner, a back surface conductive layer 2B is formed to have a thickness of 2 μm to provide a back surface conductive layer forming material 22 (FIG. 2A).

Next, both surfaces of an electric insulating material 1 composed of a polyimide tape with a thickness of 25 μm and a width of 35 mm are sandwiched by the surface conductive layer forming material 21 and the back surface conductive layer forming material 22 via an epoxy system adhesive layer 13 with a thickness of 12 μm, and stuck with each other by a roll laminator (FIG. 2B). The sticking temperature is 170° C. Thereafter, the epoxy resin system adhesive layer 13 was cured by heating at 160° C. for 60 minutes. In addition, feeding holes (perforation holes) with a constant pitch of 4.75 mm are continuously formed at both ends in a widthwise direction of the electric insulating material 1 composed of the polyimide tape. The feeding holes are opened by using a punching die. An effective width of regions inside the feeding holes where the wiring can be formed is 26.5 mm.

Next, the backing copper foil 12 is exfoliated after curing the epoxy resin system adhesive layer 13, a surface conductive layer 2A and a back surface conductive layer 2B are formed on both surfaces of the electric insulating material 1 respectively via the adhesive layer 13, to provide a multilayered base material 23 (FIG. 2C).

Next, a conductive layer hole 4 is formed by the photochemical etching process (FIG. 2D). A diameter of the conductive layer hole 4 is determined to be 50 μm. For the chemical etching, aqueous ferric chloride is used.

Thereafter, a via hole 5 is formed by $CO_2$ laser with using the conductive layer except an opening as a mask (FIG. 2E). A smear (undecomposed residue) left at a surface and a periphery of the via hole 5 is removed by an oxygen plasma.

Next, a photosensitive dry film photoresist with a thickness of 10 μm is stuck to both surfaces respectively to form a photosensitive plating resist pattern on both surfaces. After sticking, the exposure and development are conducted to complete the photosensitive plating resist pattern 14 (FIG. 2F). The exposing process is conducted simultaneously for both surfaces by using a double-side exposing apparatus having a feeding and positioning mechanism using the perforation holes as standard.

After forming the photosensitive plating resist pattern 14, the electrolytic copper plating is conducted in a copper sulfate plating bath, after the plating conditioning such as degreasing-pickling, activation, or the like is conducted. A copper plating filler 15 is provided in the via hole 5, as well as a surface wiring layer 9A and a back surface wiring layer 9B are formed (FIG. 2G). This plating process is conducted by using a series of electroplating apparatuses vertically arranged, which conduct the processes of wiring formation at a surface of the back surface conductive layer, via hole filling, and wiring formation at a surface of the surface conductive layer in this order.

Finally, the photosensitive plating resist pattern 14 at the front and back surfaces are removed (FIG. 2H), furthermore, the surface conductive layer 2A and the back surface conductive layer 2B are removed by dissolving with using hydrogen peroxide supplemented ammonium solution, so that a double-sided wiring board 11 is completed (FIG. 2I).

The Second Preferred Embodiment

Structure of a Double-Sided Wiring Board

Figure 3:
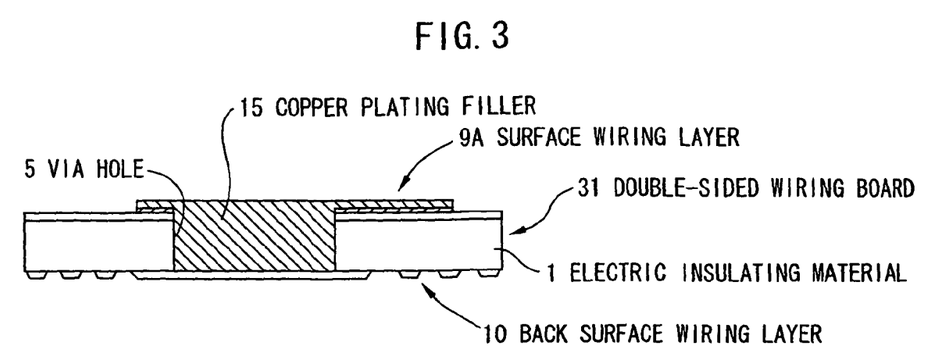
FIG. 3 is a cross sectional view showing a double-sided wiring board in the second preferred embodiment according to the present invention.

FIG. 3 shows a cross sectional view of a double-sided wiring board in the second preferred embodiment according to the present invention.

A double-sided wiring board 31 comprises an electric insulating material 1, a via hole 5 penetrating through the electric insulating material 1 from a front surface to a back surface, a copper plating filler 15 for filling the via hole 5, a surface wiring layer 9A formed continuously with the copper plating filler 15 on the front surface, and a back surface wiring layer 10 composed of a copper foil formed on the back surface.

Method for Fabricating the Double-Sided Wiring Board

Based on FIGS. 4A to 4G, a method for fabricating the double-sided wiring board shown in FIG. 3 is explained.

Figure 4A:
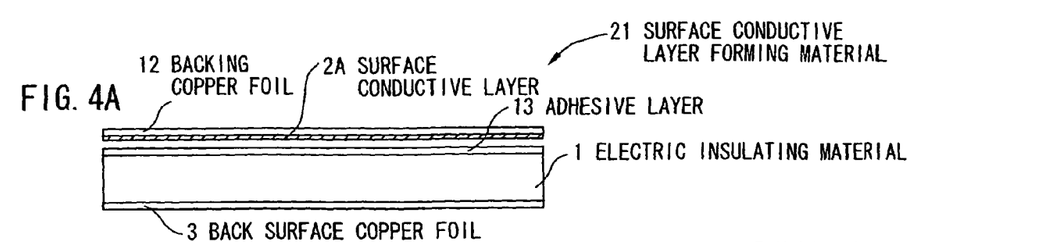
FIGS. 4A to 4G are cross sectional views showing a method for fabricating the double-sided wiring board shown in FIG. 3.

In the second preferred embodiment, as shown in FIG. 4A, a material in which a back surface copper foil 3 is formed on a back surface of the electric insulating material 1 is used. For the electric insulating material 1, polyimide may be used similarly to the first preferred embodiment. Further, similarly to the first preferred embodiment, a polyimide tape having a width of 35, 70, or 105 mm and a thickness of 25 or 38 μm may be used. A thickness of the back surface copper foil 3 may be, for example, 12 μm. For adhering the back surface copper foil 3 to the electric insulating material 1 composed of polyimide, an adhesive composed of thermoplastic modified polyimide resin may be used.

In addition, as explained in the Example 1, it is preferable that feeding holes (perforation holes) with a constant pitch of 4.75 mm are continuously formed at both ends in a widthwise direction of the electric insulating material 1.

Next, a surface conductive layer forming material 21 is prepared for forming a surface conductive layer 2A on the front surface of the electric insulating material 1. The surface conductive layer forming material 21 made by providing a surface conductive layer 2A on one surface of the backing copper foil 12 as explained in first preferred embodiment.

Figure 4B:
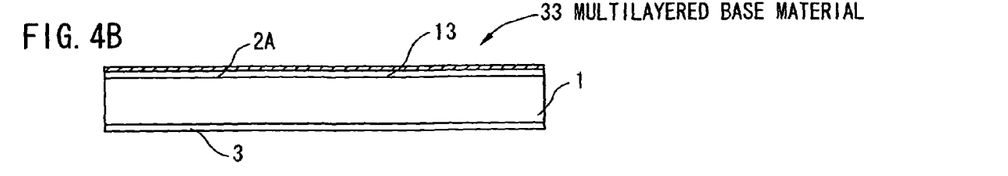

Next, after sticking the surface conductive layer forming material 21 to the front surface of the electric insulating material 1 via the adhesive 13 by using a roll laminator, the backing copper foil 12 is exfoliated to provide a multilayered base material 33, on which the surface conductive layer 2A is formed at its front surface (FIG. 4B).

Figure 4C:
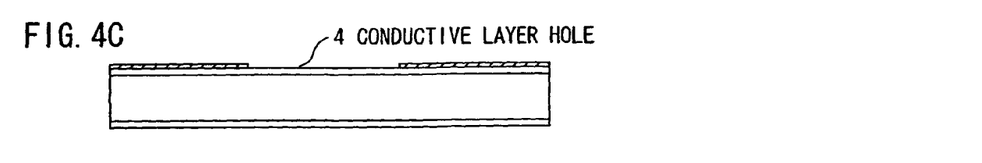
Figure 4D:
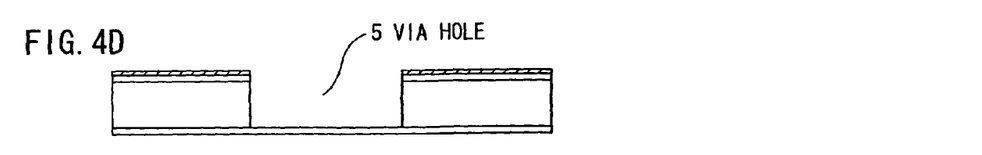

Furthermore, a conductive layer hole 4 is formed on the surface conductive layer 2A by photochemical etching (FIG. 4C). Then a via hole 5 is formed by the process similar to the first preferred embodiment (FIG. 4D).

Figure 4E:
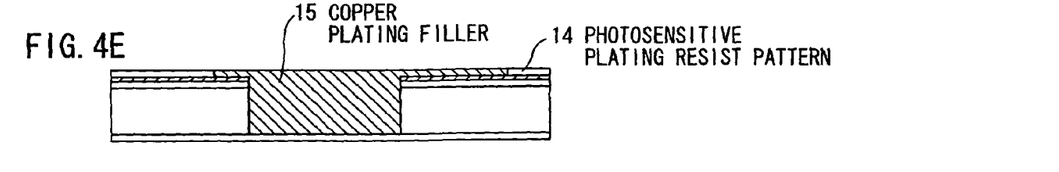

Next, the back surface copper foil 3 is masked by a tape or the like after forming the photosensitive plating resist pattern 14, and the electrolytic copper plating is conducted by using the back surface copper foil 3 as cathode. Thereafter, the copper plating is conducted for an opening of the via hole 5 to provide a copper plating filler 15, subsequently, the pattern plating is conducted (FIG. 4E). The electroplating apparatus and the copper plating solution used in the first preferred embodiment may be used. However, it is enough to provide the anode for electroplating only on the side of the surface conductive layer 2A.

Figure 4F:
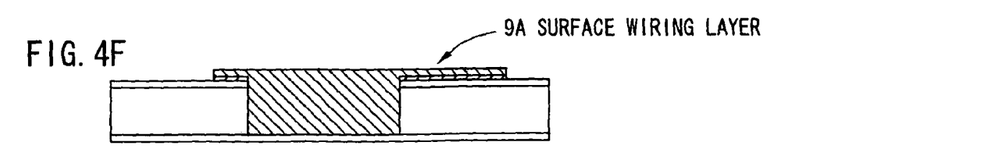

After the electrolytic copper plating, the photosensitive plating resist pattern 14 is removed by exfoliating, furthermore the surface conductive layer 2A is removed by dissolving, so that the surface wiring layer 9A is completed (FIG. 4F). For removing the surface conductive layer by dissolving, the hydrogen peroxide supplemented ammonium solution, the hydrogen peroxide supplemented sulfuric acid solution, and the aqueous ferric chloride may be used similarly to the first preferred embodiment.

Figure 4G:
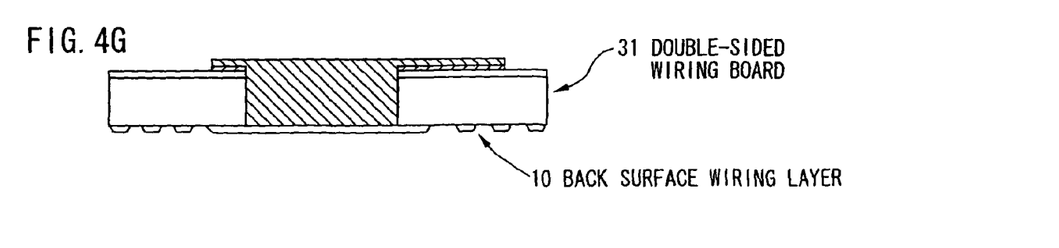

Finally, a back surface wiring layer 10 is formed by photo chemical etching the back surface copper foil 3 on the back surface, so that a double-sided wiring board 31 is completed (FIG. 4G).

Effect of the Second Preferred Embodiment

In this preferred embodiment, similarly to the first preferred embodiment, the wiring density can be improved the manufacturing cost can be reduced, and the improvement in the reliability of the multilayer wiring board can be expected.

Third Preferred Embodiment

Structure of a Double-Sided Wiring Board

Figure 5:
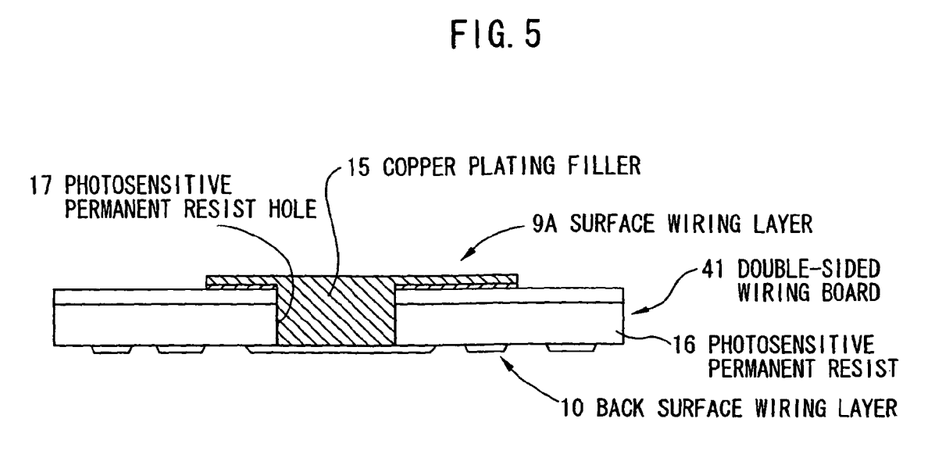
FIG. 5 is a cross sectional view showing a double-sided wiring board in the third preferred embodiment according to the present invention.

FIG. 5 shows a cross sectional view of a double-sided wiring board in the third preferred embodiment according to the present invention.

A double-sided wiring board 41 comprises a photosensitive permanent resist 16, a photosensitive permanent resist hole 17 penetrating through the photosensitive permanent resist 16 from a front surface to a back surface, a copper plating filler 15 for filling the photosensitive permanent resist hole 17, a surface wiring layer 9A formed on the front surface of the photosensitive permanent resist 16, and a back surface wiring layer 10 formed on the back surface of the photosensitive permanent resist 16.

Method for Fabricating the Double-Sided Wiring Board

Based on FIGS. 6A to 6J, a method for fabricating the double-sided wiring board shown in FIG. 5 is explained.

Figure 6A:
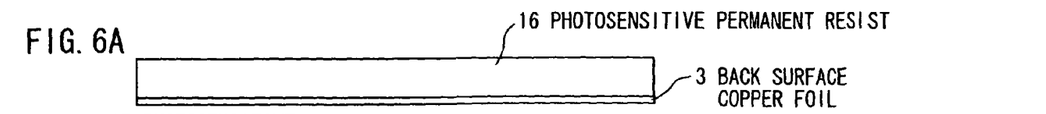
FIGS. 6A to 6J are cross sectional views showing a method for fabricating the double-sided wiring board shown in FIG. 5.

At first, as shown in FIG. 6A, the photosensitive permanent resist 16 is applied to the back surface copper foil 3 by screen printing. For the back surface copper foil 3, an electrolytic copper foil or a rolled copper foil may be used, and the commercialized products having a thickness of 12 μm, 18 μm or the like may be used. In addition, concerning the width, a material having the most suitable width required for the wiring board fabrication, for example, 35 mm, 70 mm, 105 mm or the like may be used. Further, similarly to the first preferred embodiment, it is preferable that feeding holes (perforation holes) with a constant pitch of 4.75 mm are continuously formed at both ends in a widthwise direction of the photosensitive permanent resist 16. In addition, for the photosensitive permanent resist 16 to be applied, for example, a photosensitive solder resist (heat-resistant solder resist) may be also used. In a case where this solder resist is used, it is possible to obtain a permanent resist film having a desired thickness by selecting a thickness of the printing mask in the screen printing. For example, in a silkscreen printing, a film thickness of about 20 μm can be obtained in one time of the printing.

Figure 6B:
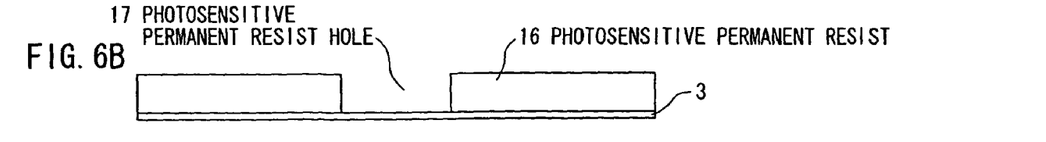

Next, after the exposure and development processes, a photosensitive permanent resist via hole 17 is formed in a predetermined point of the photosensitive permanent resist 16 (FIG. 6B). A diameter of the photosensitive permanent resist via hole 17 is determined in accordance with an exposure mask and resolution of the photosensitive permanent resist 16. In the photosensitive solder resist, a resist hole with a normal diameter of 60 μm, which is a small diameter, can be generally formed.

Figure 6C:
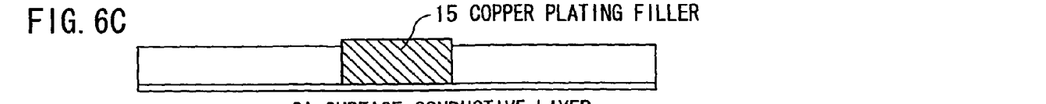

Thereafter, a copper plating filler 15 is formed by conducting the electrolytic copper plating with using the back surface copper foil 3 as cathode (FIG. 6C). A thickness of the copper plating filler 15 is slightly greater than a thickness of the photosensitive permanent resist 16.

Figure 6D:
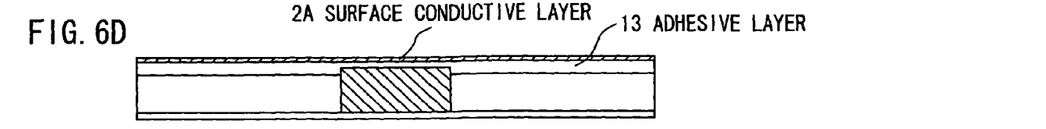

Next, a surface conductive layer forming material is further stuck on the surface of photosensitive permanent resist 16 via an adhesive layer 13. The surface conductive layer forming material comprising a surface conductive layer 2A formed on one surface of the backing copper foil is same as that used in the second preferred embodiment. The backing copper foil is exfoliated after curing the adhesive layer 13 to form a surface conductive layer 2A on the surface of the photosensitive permanent resist 16 (FIG. 6D).

Figure 6E:
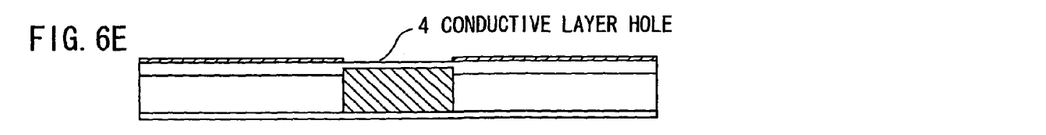
Figure 6F:
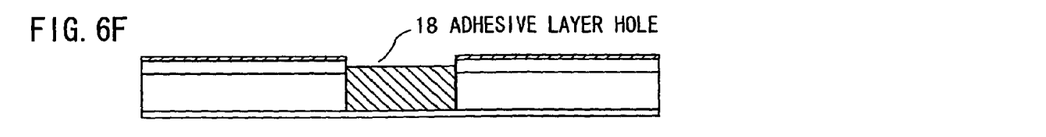

Furthermore, a conductive layer hole 4 is formed on the surface conductive layer 2A by photochemical etching process (FIG. 6E). Then the adhesive layer 13 left on a top of the copper plating filler 15 is removed to form an adhesive layer hole 18 (FIG. 6F). For removing the adhesive layer 13, the $CO_2$ laser or the oxygen plasma may be used. The wet processing using an oxidizing chemical agent such as permanganic acid aqueous solution may be also used.

Figure 6G:
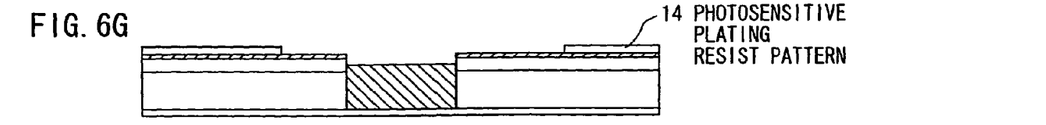

Next, a photosensitive plating resist pattern 14 is formed similarly to the first preferred embodiment (FIG. 6G). As for the photosensitive plating resist pattern 14, the high density wiring pattern can be formed similarly to the first preferred embodiment.

Figure 6H:
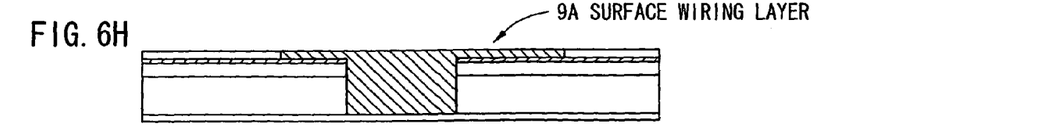

After forming the photosensitive plating resist pattern 14, the electrolytic copper plating is conducted with using the back surface copper foil 3 as cathode, to form a plating pattern on the surface. As a result, a surface wiring layer 9A is formed (FIG. 6H).

Figure 6I:
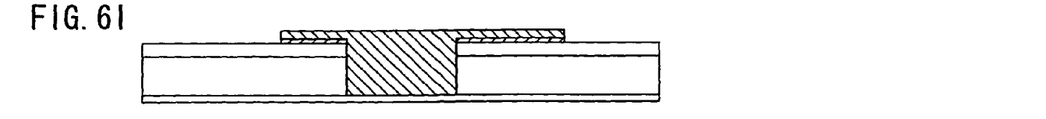

After completing the electrolytic copper plating to have a predetermined thickness, the photosensitive plating resist pattern 14 is exfoliated and the surface conductive layer 2A is removed by dissolving (FIG. 6I). For removing the surface conductive layer 2A by dissolving, the hydrogen peroxide supplemented ammonium solution, the hydrogen peroxide supplemented sulfuric acid solution, and the aqueous ferric chloride may be used similarly to the first preferred embodiment.

Figure 6J:
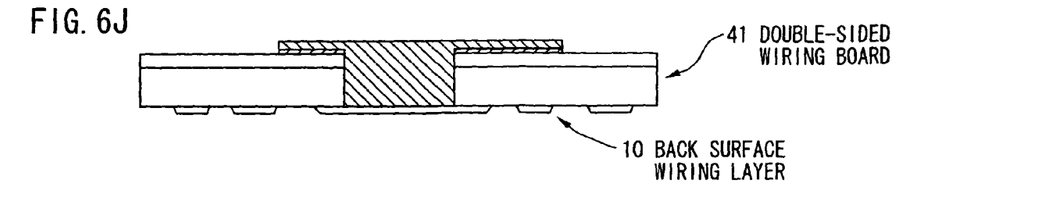

Finally, the back surface copper foil 3 is provided with a pattern by photochemical etching, so that a double-sided wiring board 41 is completed (FIG. 6J).

Effect of the Third Preferred Embodiment

In the third preferred embodiment, similarly to the first preferred embodiment, the wiring density can be improved, the manufacturing cost can be reduced, and the improvement in reliability of the multilayer wiring board can be expected. In addition, since the photosensitive permanent resist is used as the electric insulating material, the formation of the via hole can be conducted by the exposure and development without using the expensive dry process of $CO_2$ laser, so that the manufacture cost can further reduced.

Fourth Preferred Embodiment

Structure of a Triple Layer Wiring Board

Figure 7:
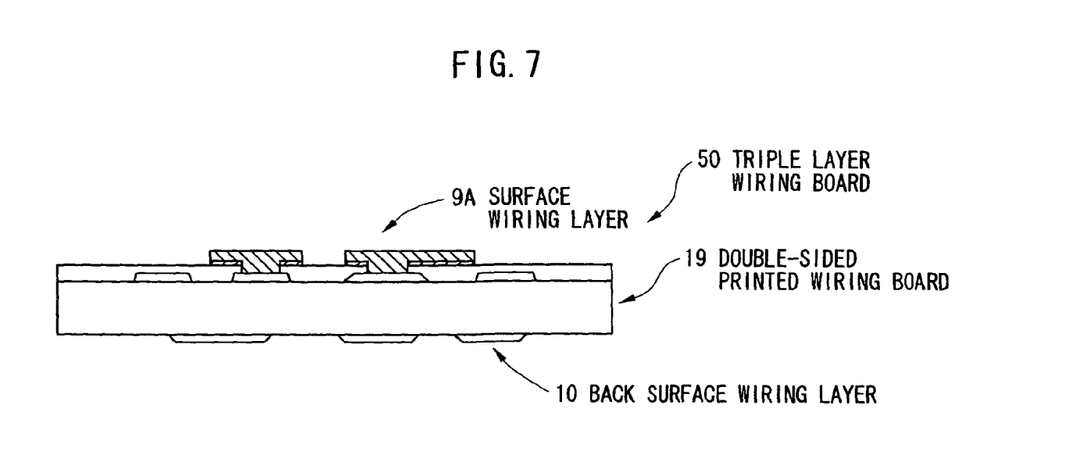
FIG. 7 is a cross sectional view showing a triple layer wiring board in the fourth preferred embodiment according to the present invention.

FIG. 7 shows a cross sectional view of a triple layer wiring board in the fourth preferred embodiment.

A triple layer wiring board 50 comprises a double-sided printed wiring board 19 generally used, via holes 5 provided at a predetermined point of a front surface (upper surface) of the double-sided printed wiring board 19, a copper plating filler 15 for filling the via hole 5, a surface wiring layer 9A formed on the front surface of the double-sided printed wiring board 19, and a back surface wiring layer 10 composed of a copper foil formed on the back surface of the double-sided printed wiring board 19.

As the copper foil used for the double-sided printed wiring board 19, a rolled copper foil having a wiring width of 50 to 200 μm and a wiring interval of 50 to 200 μm is now commercialized. In addition, as the electric insulating material for the double-sided printed wiring board 19, an epoxy resin reinforced by glass fiber may be mainly used. For example, a material such as FR4, FR5 having a thickness of 0.2 to 1.0 mm may be usually used.

As for the printed wiring board, the most suitable layer number is selected based on digital functions of an electronic device, e.g. double-sided wiring board, four layer wiring board, six layer wiring board or the like. However, in view of the object for miniaturizing and sliming the electronic device such as a cellular phone, a digital still camera, a digital video camera, the slimming of the wiring board is indispensable. Accordingly, it is attempted to reduce the number of layers required for actual interconnection and wiring layout.

Method for Fabricating a Triple Layer Wiring Board

Based on FIGS. 8A to 8F, a method for fabricating the triple layer wiring board shown in FIG. 7 is explained.

Figure 8A:
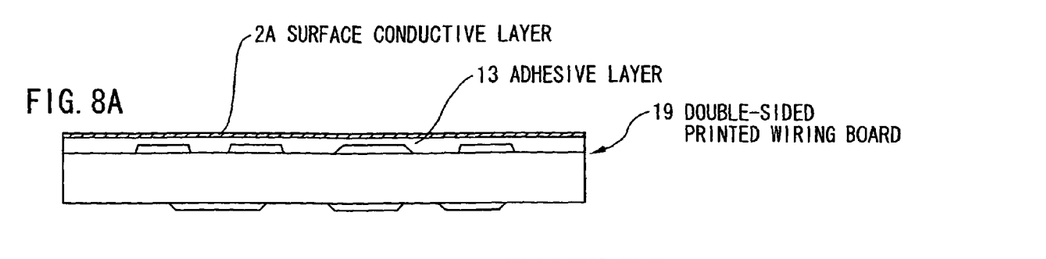
FIGS. 8A to 8F are cross sectional views showing a method for fabricating the triple layer wiring board shown in FIG. 7.

Firstly, a generally-used double-sided printed wiring board 19 is prepared. Further, a surface conductive layer forming material made by providing a surface conductive layer 2A on one surface of the backing copper foil which is used in the second preferred embodiment is prepared. After sticking the surface conductive layer forming material to the front surface of the electric insulating material 1 via the adhesive 13, the adhesive 13 is cured, then the backing copper foil is exfoliated to provide the surface conductive layer 2A on a surface of the double-sided printed wiring board 19 (FIG. 8A).

Figure 8B:
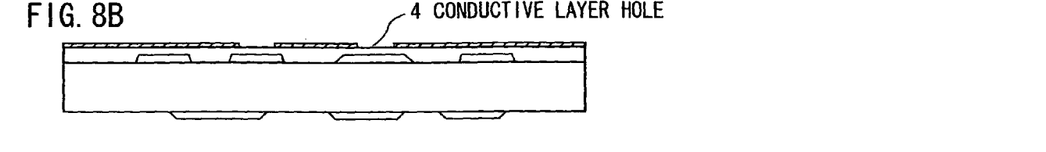
Figure 8C:
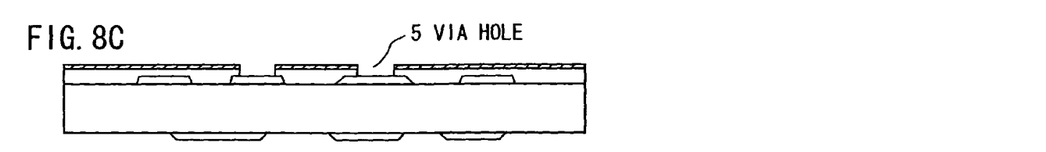
Figure 8D:
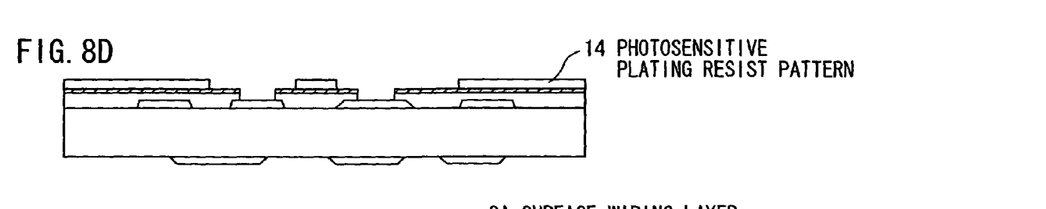

Next, a conductive layer hole 4 is formed on the surface conductive layer 2A by photochemical etching (FIG. 8B). Then a via hole 5 is formed by chemical etching (FIG. 8C). The formation of the via hole 5 may be conducted by the process similar to the first preferred embodiment. The size of the via hole 5 is determined based on a wiring density and a current capacitance required for connecting to the double-sided printed wiring board 19, for example, a diameter of the via hole 5 may be in a range of 50 to 100 μm.

A palladium catalyst processing is conducted after forming the via hole 5. It is to provide an inner wall of the via hole 5 with the conductivity.

Furthermore, a photosensitive plating resist pattern 14 is formed (FIG. 8C). Thereafter, the electrolytic copper plating is conducted by using the back surface copper foil 3 as cathode to fill the via hole 5 and to form a surface wiring layer 9A (FIG. 8E) The electrolytic copper plating bath is conducted by using the copper sulfate plating solution similarly to the first preferred embodiment. A thickness of the surface wiring layer 9 is selected from a range of 10 to 20 μm. A wiring pitch is determined based on resolution of the photosensitive plating resist. Further, the most suitable wiring pitch and the wiring layout may be designed in accordance with an external output terminal pitch or connecting method of a device on which the wiring board is generally mounted.

Figures 8E, 8F:
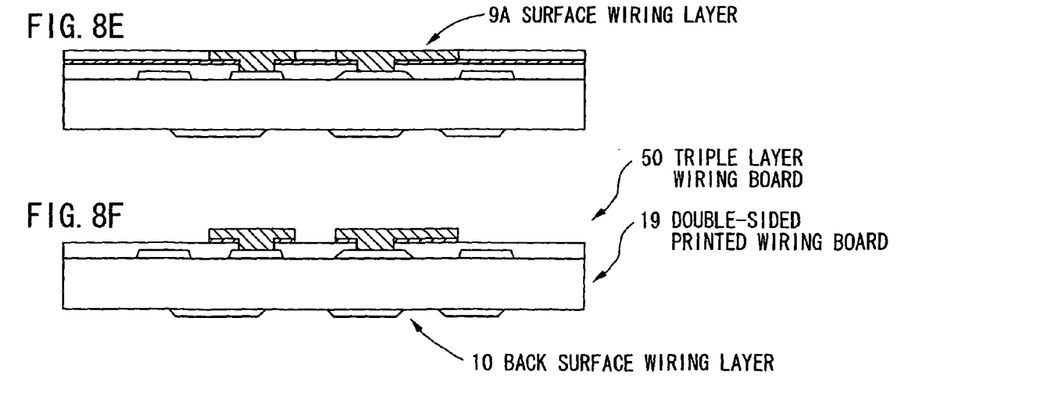

After forming the surface wiring layer, the photosensitive plating resist pattern 14 and the surface conductive layer 2A are removed, similarly to the first preferred embodiment, so that the triple layer wiring board 50 is completed (FIG. 8F).

Further, a four layer wiring board may be fabricated by forming a wiring layer on the back surface according to the similar process.

In the fourth preferred embodiment, the method for fabricating a multilayer wiring board using the printed wiring board is shown. However, it is possible to fabricate a multilayer wiring board in which an inner layer board is also a high density multilayer wiring board, by forming a surface conductive layer via an adhesive layer on the double-sided wiring board fabricated in the first preferred embodiment, and by conducting the process similar to the fourth preferred embodiment.

Effect of the Fourth Preferred Embodiment

In the fourth preferred embodiment, similarly to the first preferred embodiment, the wiring density can be improved, the manufacturing cost can be reduced, and the improvement in the reliability of the multilayer wiring board can be expected.

Other Preferred Embodiment

The present invention may be applied to all the electronic devices in that the miniaturization and slimming, the light weighting, and the high functions are desired. In concrete, the present invention may be applied to a semiconductor package substrate for a high-speed memory, a semiconductor package substrate for high-speed logical operation, a package substrate equipped with a small and thin passive element or the like. In addition, as for the method for mounting the aforementioned semiconductor chip on a semiconductor package substrate, the wire bonding, the flip-chip bonding, the bump bonding, or the like may be used, but not limited thereto. Furthermore, the present invention may be applied to a high density wiring board equipped with the aforementioned semiconductor package.

As for the semiconductor package, it is desired that the output terminal pitch is narrowed more and more. For example, in a CSP (Chip Scale Package), a terminal pitch of a bump is reduced to 0.3 mm. For this reason, it is required that the terminal pitch of the wiring board is 0.3 mm or less. In addition, it is required that the wiring pitch is 50 μm or less. As thus described, the present invention is suitable for the semiconductor package in that the output terminal pitch is required to be narrowed.

In addition, the present invention may be also applied to the electronic devices in the IT-related field, the robot field or the like. Further, the present invention may be also applied to the electronic control device for the latest bio-devices, MEMS related devices or the like.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method for fabricating a multilayer wiring board, comprising:
   preparing a conductive layer forming material comprising a film-shaped reinforcing material and a separable thin film type conductive layer formed on the film-shaped reinforcing material;
   transcribing the thin film type conductive layer from the conductive layer forming material to both surfaces of a lengthy electric insulating material to form a surface conductive layer and a back surface conductive layer;
   providing a via hole penetrating through the surface conductive layer and the electric insulating material;
   forming a pattern composed of a photosensitive plating resist film with a desired shape at a predetermined position on the surface conductive layer and the back surface conductive layer;
   performing an electrolytic deposition using the back surface conductive layer as a cathode to fill the via hole with an electroplating metal and to form a surface wiring layer and a back surface wiring layer respectively at a space in the pattern of the photosensitive plating resist film; and
   removing the photosensitive resist film as well as the surface conductive layer and the back surface conductive layer provided under the photosensitive resist film to form a conductive wiring pattern comprising the surface wiring layer and the back surface wiring layer.

2. A method for fabricating a multilayer wiring board, comprising:
   preparing a conductive layer forming material comprising a film-shaped reinforcing material and a separable thin film type conductive layer formed on the film-shaped reinforcing material; transcribing the thin film type conductive layer from the conductive layer forming material to both surfaces of a lengthy electric insulating material, in which a film shaped back surface conductive layer is formed at its back surface, to form a surface conductive layer and a back surface conductive layer;
   providing a via hole penetrating through the surface conductive layer and the electric insulating material;
   forming a pattern composed of a photosensitive plating resist film with a desired shape at a predetermined position on the surface conductive layer;
   performing an electrolytic deposition using the back surface conductive layer as a cathode to fill the via hole with an electroplating metal and to form a surface wiring layer at a space in the pattern of the photosensitive plating resist film;
   removing the photosensitive resist film as well as the surface conductive layer provided under the photosensitive resist film to form a conductive wiring pattern comprising the surface wiring layer; and
   forming a conductive wiring pattern composed of a back surface wiring layer from the back surface conductive layer.

3. A method for fabricating a multilayer wiring board, comprising:
   applying a photosensitive permanent resist on a film shaped back surface conductive layer;
   providing a via hole on the photosensitive permanent resist;
   performing an electrolytic deposition using the back surface conductive layer as cathode to fill the via hole with an electroplating metal over a region which is longer than a length of the via hole;
   preparing a conductive layer forming material comprising a film-shaped reinforcing material and a separable thin film type conductive layer formed on the film-shaped reinforcing material;
   transcribing the thin film type conductive layer from the conductive layer forming material to a surface of the photosensitive permanent resist to form a surface conductive layer;
   forming a photosensitive plating resist film pattern with a desired shape on the surface conductive layer;
   performing an electrolytic deposition using the back surface conductive layer as a cathode to form a surface wiring layer at a space in the pattern of the photosensitive plating resist film pattern;
   removing the photosensitive resist film as well as the surface conductive layer provided under the photosensitive resist film to form a conductive wiring pattern comprising the surface wiring layer; and
   forming a conductive wiring pattern composed of a back surface wiring layer from the back surface conductive layer.

4. A method for fabricating a multilayer wiring board, comprising:
   preparing a conductive layer forming material comprising a film-shaped reinforcing material and a separable thin film type conductive layer formed on the film-shaped reinforcing material;
   transcribing the thin film type conductive layer from the conductive layer forming material to a surface of an electric insulating wiring board having a conductive wiring pattern to form a surface conductive layer and a back surface conductive layer;
   providing a via hole in the surface conductive layer and the electric insulating wiring board;
   forming a pattern composed of a photosensitive plating resist film with a desired shape at a predetermined position on the surface conductive layer;
   performing an electrolytic deposition using the surface conductive layer as a cathode to fill the via hole with an electroplating metal and to form a surface wiring layer at a space in the pattern of the photosensitive plating resist film; and
   removing the photosensitive resist film as well as the surface conductive layer provided under the photosensitive resist film to form a conductive wiring pattern comprising the surface wiring layer.

5. The method for fabricating a multi layer wiring board, according to claim 4, further comprising:
   transcribing the thin film type conductive layer from the conductive layer forming material to a back surface of the electric insulating wiring board;
   providing a via hole in the back surface conductive layer and the electric insulating wiring board;
   forming another pattern composed of the photosensitive plating resist film with a desired shape at a predetermined position on the back surface conductive layer;
   performing an electrolytic deposition using the back surface conductive layer as a cathode to fill the via hole with the electroplating metal and to form a back surface wiring layer at a space in the pattern of the photosensitive plating resist film; and
   removing the photosensitive resist film as well as the back surface conductive layer provided under the photosensitive resist film to form another conductive wiring pattern comprising the back surface wiring layer.

6. The method for fabricating a multilayer wiring board, according to claim 1, wherein:
the via hole is formed by laser beam method, dry chemical etching method, or reactive plasma etching.

7. The method for fabricating a multilayer wiring board, according to claim 1, wherein:
the surface conductive layer is processed by photochemical etching method or direct laser beam method.

8. The method for fabricating a multilayer wiring board, according to claim 1, further comprising:
before said performing said electrolytic deposition, performing a palladium catalyzing treatment to enhance an adhesion between an inner wall of the via hole and the electroplating metal.

* * * * *